United States Patent [19]

Wetzel

[11] Patent Number: 4,833,393
[45] Date of Patent: May 23, 1989

[54] CIRCUIT ARRANGEMENT FOR CAPACITANCE OR ADMITTANCE MEASUREMENT

[75] Inventor: Gustav Wetzel, Lörrach, Fed. Rep. of Germany

[73] Assignee: Endress u. Hauser GmbH u. Co., Fed. Rep. of Germany

[21] Appl. No.: 94,860

[22] Filed: Sep. 9, 1987

[30] Foreign Application Priority Data

Oct. 3, 1986 [DE] Fed. Rep. of Germany ....... 3633792

[51] Int. Cl.⁴ .......................................... G01R 27/02
[52] U.S. Cl. .............................. 324/60 SD; 324/60 R; 324/61 R
[58] Field of Search ................. 73/304 C; 340/870.37; 324/57 R, 60 R, 60 C, 60 CD

[56] References Cited

U.S. PATENT DOCUMENTS

| | | | |
|---|---|---|---|
| 4,142,144 | 2/1979 | Rohr | 324/60 CD |
| 4,243,933 | 1/1981 | Rollman | 324/60 CD |
| 4,339,709 | 7/1982 | Brihier | 340/870.37 |
| 4,389,646 | 6/1983 | Tago | 340/870.37 |
| 4,390,879 | 6/1983 | Kimura | 340/870.37 |
| 4,719,409 | 1/1988 | Dorman | 340/870.37 |

FOREIGN PATENT DOCUMENTS 1249404 9/1967 Fed. Rep. of Germany.

Primary Examiner—Reinhard J. Eisenzopf
Assistant Examiner—Jose M. Solis
Attorney, Agent, or Firm—Barnes & Thornburg

[57] ABSTRACT

The circuit arrangement is used for capacitance or admittance measurement by the principle of apparent current measurement in that to the capacitance or admittance to be measured an AC voltage of fixed magnitude and fixed frequency is applied and the AC current flowing through the capacitance or admittance is used as a measure of the measured value. The test object whose capacitance or admittance is to be measured lies in the emitter circuit of a transistor connected as voltage follower, to the base electrode of which the AC voltage is applied. The emitter terminal of the transistor connected to the test object is connected to the corresponding pole of the operating voltage source via an adjustable current source. The collector connection of the transistor is connected via an impedance of high resistance for alternating current to the other pole of the operating voltage source. Connected to the collector is a rectifier circuit which converts the alternating current applied thereto to a measuring DC voltage proportional thereto. The direct current flowing via the adjustable current source is set in dependence upon the measuring DC voltage such that it is always slightly greater than the peak value of the alternating current flowing through the test object. Instead of a transistor, another amplifier element with controllable current path may also be used, for example a field-effect transistor. The impedance of high resistance to alternating current is preferably a second adjustable current source which is so constructed that it is controlled automatically to synchronize with the first adjustable current source.

8 Claims, 2 Drawing Sheets

CIRCUIT ARRANGEMENT FOR CAPACITANCE OR ADMITTANCE MEASUREMENT

The invention relates to a circuit arrangement for the capacitance or admittance measurement by the principle of apparent current measurement in which to the capacitance or admittance to be measured an AC voltage of fixed magnitude and frequency is applied and the alternating current flowing through the capacitance or admittance is used as measure of the measured value.

Circuits of various types are known for capacitance measurement by the principle of apparent current measurement, a fixed AC voltage with fixed frequency being applied to the test object having the capacitance to be measured. The AC current flowing through the test object is proportional to the voltage, the frequency and the capacitance to be measured. If the voltage and frequency are kept constant the AC current is a measure of the capacitance. A known field of use of capacitance measuring circuits is the capacitive filling level measurement in which the test object is a capacitive probe which projects into a container and the capacitance of which depends on the filling level in the container. Since the AC current flowing through the test object is also proportional to the admittance (i.e. apparent conductance) the admittance of the test object can also be measured with the same measuring circuit.

Since with this measuring principle the measuring AC current flowing through the test object is proportional to the measured value the known measuring circuits are designed for the current requirement corresponding to the largest measured value occurring. The current consumption with smaller measured values is then larger than is really necessary for such smaller measured values. The known measuring circuits are thus not very suitable when in test objects with measured values varying over a large range there is a need to minimize the current consumption or if the available current itself even depends on the measured value. This latter condition exists in particular in the widespread measuring circuits which draw their supply direct current from a remote location via a two-wire line via which the measured value signal is also transmitted in that the total current flowing through the two-wire line, also including the supply direct current, is varied in dependence upon the measured value between two limit values (generally between 4 and 20 mA). To obtain measuring AC currents of adequate magnitude the known measuring circuits must therefore frequently operate with considerable measuring voltages and this is undesirable or even inadmissible in many uses. Also, many known measuring circuits can operate only in a narrow frequency range.

The problem underlying the invention is to provide a circuit arrangement operating by the principle of apparent current measurement for capacitance or admittance measurement which with a small current requirement and small measuring AC voltage furnishes in a wide measuring range a maximum measured value signal and in particular permits optimum utilization of a supply direct current dependent on the measured value.

According to the invention this problem is solved in that the test object whose capacitance or admittance is to be measured lies in the output circuit of an amplifier element which is connected as voltage follower and to the control electrode of which the AC voltage is applied, that the terminal of the controlled current path of the amplifier element connected to the test object is connected to the corresponding pole of the operating voltage source via an adjustable current source, that the current path terminal of the amplifier element not connected to the test object is connected via an impedance which is high for alternating current to the other pole of the operating voltage source and to a rectifier circuit which converts the alternating current supplied thereto to a measuring DC voltage proportional thereto, and that the direct current flowing via the adjustable current sources is set in dependence upon the measuring DC voltage.

The circuit arrangement according to the invention gives the effect that the direct current taken from the voltage follower is always adapted to the alternating current governed by the measured value. The overall result of this is a minimum current consumption. In particular, however, in measuring arrangements with supply direct current dependent on the measured value the particular supply direct current available can be utilized in optimum manner for detecting the measured value within a wide measuring range. The circuit arrangement according to the invention can therefore be used with particular advantage for measuring arrangements in which the measuring circuit draws its supply direct current via a two-wire line via which the measured value signal is also transmitted by varying the direct current flowing through the two-wire line.

Advantageous further developments and embodiments of the invention are characterized in the subsidiary claims.

Further features and advantages of the invention will be apparent from the following description of an example of embodiment illustrated in the drawings, wherein:

Figure 1:
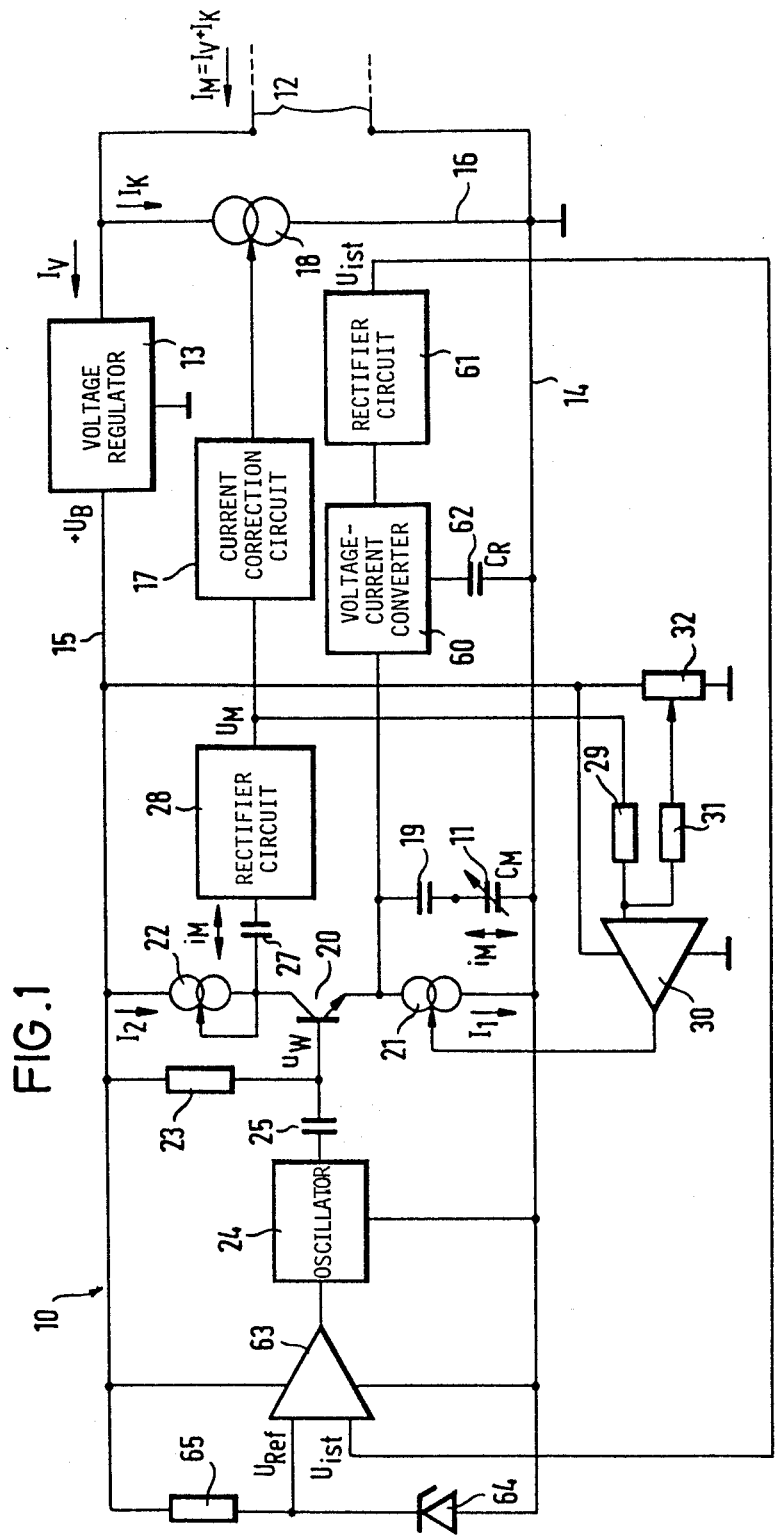
FIG. 1 is the block circuit diagram of a circuit arrangement made according to the invention and FIG. 2 is a detailed circuit diagram of the two adjustable current sources in the voltage follower stage of the circuit arrangement of FIG. 1.

The capacitance measuring circuit 10 illustrated in FIG. 1 is used to measure the variable capacitance $C_M$ of a capacitor 11 which is formed for example by a capacitive probe which projects into a container so that the probe capacitance $C_M$ is proportional to the filling level. The magnitude of the capacitance $C_M$ can therefore vary within a large range between the two limit values which correspond firstly to the empty and secondly to the full container.

The capacitance measuring circuit 10 is connected via a two-wire line 12 to an evaluation device which is not shown in the drawings and is arranged at a remote location. The capacitance measuring circuit 10 does not contain its own power source but draws the direct current energy necessary for its operation via the two-wire line 12 from a DC voltage source disposed in the evaluation device. Also transmitted via the two-wire line 12 from the capacitance measuring circuit 10 to the evaluation device is the measured value signal representing the measured value of the capacitance $C_M$. For this purpose, on the supply direct current $I_V$ transmitted via the two-wire line 12 a correction current $I_K$ is superimposed which is so dimensioned that the total current $I_M = I_V + I_K$ flowing through the two-wire line 12 represents between two limit values the measured value. Corresponding to a usual standard the total current $I_M$ is variable between the limit values 4 and 20 mA.

A voltage regulator 13 connected in the capacitance measuring circuit 10 to the two-wire line 12 produces a regulated operating DC voltage $U_B$ for the various circuit components of the capacitance measuring circuit 10. This operating DC voltage exists between two supply conductors 14 and 15 of which it is assumed that the supply conductor 14 is applied to ground whilst the supply conductor 15 carries the potential $+U_B$ positive with respect to ground.

Via the voltage regulator 13 the supply direct current $I_V$ flows. To superimpose the correction current $I_K$ on the supply direct current $I_V$ the two conductors of the two-wire line 12 are bridged by a shunt branch 16 in which an adjustable current source 18 controlled by a current correction circuit 17 lies.

The one electrode of the capacitor 11 is connected to ground and its other electrode is connected via a series capacitor 19 to the emitter of an npn transistor 20. The series capacitor 19 serves only for the direct-currrent separation of the capacitor 11 from the rest of the circuit; its capacitance is very high compared with the capacitance $C_M$ to be measured so that it is negligible in the measurement of the capacitance $C_M$.

The emitter of the transistor 20 is connected to the conductor 14 connected to ground, i.e. to the negative pole of the operating voltage $U_B$, via an adjustable current source 21. The collector of the transistor 20 is connected to the conductor 15, i.e. to the positive pole of the operating voltage $U_B$, via an adjustable current source 22. The base of the transistor 20 is connected via a base series resistor 23 to the conductor 15. Furthermore, the output of an oscillator 24 is connected via a coupling capacitor 25 to the base of the transistor 20.

A rectifier circuit 28 is connected via a coupling capacitor 27 to the collector of the transistor 20. The output of the rectifier circuit 28 is connected to the input of the current direction circuit 17 and via a summation resistor 29 to the input of an amplifier 30. The input of the amplifier 30 is also connected via a second summation resistor 31 to the tap of a potentiometer 32 lying at the operating voltage $U_B$. The output of the amplifier 30 is connected to the control input of the adjustable current source 21. The control input of the adjustable current source 22 is connected to the collector of the transistor 20.

The circuit described so far operates in the following manner:

Through the base series resistance 23 the base of the transistor 20 is subjected to a predetermined DC potential on which the AC voltage $u_W$ generated by the oscillator 24 is superimposed. The base potential is so dimensioned that the transistor 20 is linearly controlled by the AC voltage $u_W$ applied to the base. The transistor 20 is connected as voltage follower in the emitter circuit of which the series circuit of the capacitors 11 and 19 lies parallel to the current source 21. The AC voltage $u_W$ is therefore also applied in the emitter circuit to the series circuit comprising the capacitors 11 and 19. Because of its large capacitance at the frequency of the AC voltage $u_W$ the series capacitor 19 practically represents a short-circuit so that the entire AC voltage $u_W$ is applied to the capacitor 11.

The output voltage of the amplifier 30 determines the direct current $I_1$ flowing through the current source 21. The current source 22 is so constructed that it is controlled in synchronism with the current source 21 so that the direct current $I_2$ flowing through the current source 22 is always the same as the direct current $I_1$ except for the negligible base current.

The two current sources 21 and 22 represent for the alternating current a high impedance so that only a negligible small part of the alternating current produced by the AC voltage applied flows through the current sources. A measuring AC current $i_M$ governed by the AC voltage $u_W$ applied and the capacitance $C_M$ flows through the capacitor 11 in the emitter circuit and said current $i_M$ is practically equal to the emitter alternating current $i_E$. In the collector circuit a collector alternating current flows which is reduced compared with the emitter alternating current by the transfer factor is $$i_C = i_E \cdot \frac{\beta}{1+\beta},$$

this current also being approximately equal to the measuring alternating current $i_M$ when the current amplification B is high enough. Because of the high impedance of the current source 22 almost the entire alternating current $i_M$ flows to the low resistance input of the rectifier circuit 28. The rectifier circuit 28 generates at the output a measuring DC voltage $U_M$ which is proportional to the alternating current applied to its input.

The measurement of the capacitance $C_M$ is based on the principle of the apparent current measurement: Since the AC voltage applied in the emitter circuit of the transistor 20 to the series circuit comprising the capacitors 11 and 19 is constant the alternating current $i_M$ flowing through said circuit branch is proportional to the admittance (i.e. the apparent conductance) of this circuit branch. Accordingly, the measuring DC voltage $U_M$ furnished at the output of the rectifier circuit 28 is also proportional to this admittance. As mentioned, the capacitance of the series capacitor 19 is so high that said capacitor 19 can practically be regarded as a short circuit for the alternating current. If the capacitor 11 is loss-free, its admittance is a pure reactance of the value $2\pi f C_M$. For constant frequency of the oscillator 24 the voltage $U_M$ in this case is therefore proportional to the capacitance $C_M$ to be measured. The measuring circuit described is however basically suitable for measuring the admittance of any desired test object connected in place of the capacitor 11. This fact is for example utilized also in the capacitive filling level measurement when the capacitive probe forming the capacitor 11 is lossy as can be the case in the measurement of the filling level of certain filling materials. In this case the admittance is proportional to the filling level and the measuring DC voltage $U_M$ is again a measure of the filling level.

In each case the measuring DC voltage $U_M$ representing the measured value is applied to the current correction circuit 17 which through the control of the adjustable current source 18 adjusts the correction current $I_K$ flowing through the shunt branch 16 so that the total current $I_M$ flowing through the two-wire line 12 is in a predetermined relationship to the measuring DC voltage $U_M$ and thereby represents the measured value.

The particular feature of the voltage follower stage including the transistor 20 resides in that by the two adjustable current sources 21, 22 connecting the collector-emitter path to the two poles of the operating voltage a constant direct current is necessarily withdrawn on which the measuring alternating current $i_M$ can be superimposed only between the two current sources. If the base voltage increases due to the superimposed AC voltage the capacitor 11 is charged by a correspondingly increasing current via the collector-emitter path. Since said increasing current cannot be supplied via the current source 22 it is taken from the rectifier circuit 28. When the base voltage becomes smaller again the capacitor 11 discharges through an oppositely directed current which must now flow through the current source 21. The corresponding current component then flows from the current source 22 into the rectifier circuit 28.

It follows from this mode of operation that the direct current $I_1$ flowing through the current source 21 must always be greater than the peak value of the alternating current $i_M$ flowing through the capacitor 11. This peak value is however proportional to the capacitance $C_M$ to be measured. If the current source 21 were fixedly set the direct current $I_1$ would have to be continuously adjusted corresponding to the greatest value occurring of the capacitance $C_M$ to be measured. This current would have to be available even when the total current $i_M$ flowing through the two-wire line 12 at the smallest occurring value of the capacitance $C_M$ had the lower limit value of 4 mA. Since in this current of 4 mA the supply direct current of the remaining circuit components of the capacitance measuring circuit 10 is also contained there would then be available for the capacitance measuring also at the largest value of the capacitance $C_M$ occurring only a fraction of the current of 4 mA. The maximum amplitude of the measuring alternating current $i_M$ would be restricted to this fraction; with smaller capacitance values it would be correspondingly smaller.

In the capacitance measuring circuit illustrated in FIG. 1 by the control circuit containing the amplifier 30 a capacitance measurement with a substantially larger measuring alternating current $i_M$ is possible. By this control circuit the direct current $I_1$ flowing through the current source 21 is made to follow up in dependence upon the measuring DC voltage $U_M$ so that it is always slightly greater than the peak value of the measuring alternating current $i_M$ which flows through the capacitor 11 at the respective value of the capacitance $C_M$. As a result, at the highest occurring value of the capacitance $C_M$ the maximum value (20 mA) of the total current $I_M$ flowing through the two-wire line 12 can be utilized. With smaller values of the capacitance $C_M$ the measuring DC voltage $U_M$ becomes smaller so that both the total current $I_M$ flowing through the two-wire line 12 and the direct current $I_1$ flowing through the current source 21 are reduced. Since however at smaller capacitance values the amplitude of the measuring alternating current $i_M$ also becomes smaller the supply direct current $I_M$ available suffices for a direct current $I_1$ large enough to discharge the capacitor 11. The capacitance measurement is therefore always with optimum utilization of the available supply direct current.

By means of the potentiometer 32 in the current source 21 a small basic current independent of the measuring voltage $U_M$ can be set to ensure the startup of the circuit.

Whereas the current source 21 is externally controlled by the output voltage of the amplifier 30 in dependence upon the measuring voltage $U_M$, the current source 22 is controlled automatically to synchronism with the current source 21. This is necessary in a series circuit of current sources to prevent that one of the current sources runs up to the stop in the one or other direction.

Figure 2:
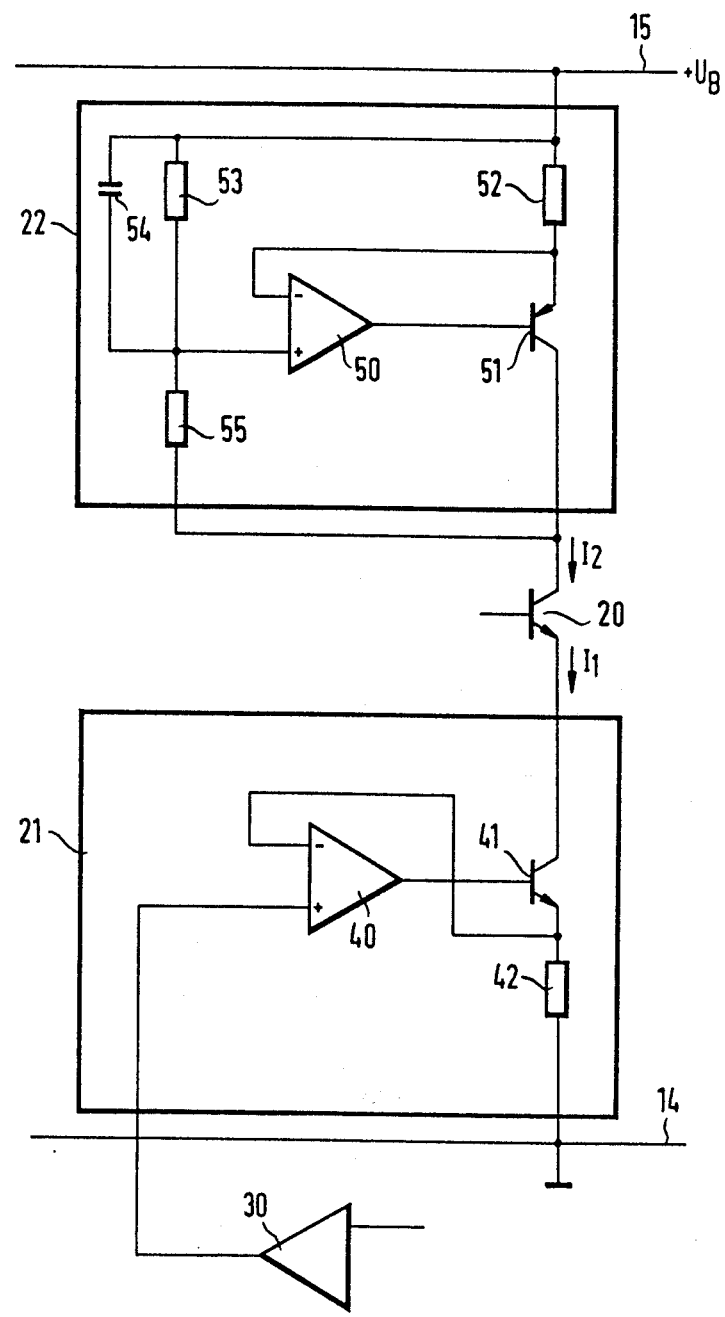

FIG. 2 shows an example of embodiment of the two current sources 21 and 22 with which this effect is achieved. The current source 21 includes in a manner known per se an operational amplifier 40 whose output is connected to the base of an npn transistor 41. The collector of the transistor 41 is connected to the emitter of the transistor 20 and the emitter of the transistor 41 is connected via a resistor 42 to the conductor 14 connected to ground. The inverting input of the operational amplifier 40 is directly connected to the connection point between the resistor 42 and the emitter of the transistor 41. The output of the amplifier 30 is connected to the non-inverting input of the operational amplifier 40. The current $I_1$ flowing through the transistor 41 thus depends on the voltage of the amplifier 30.

In corresponding manner the current source 22 includes an operational amplifier 50 whose output is connected to the base of a pnp transistor 51. The collector of the transistor 51 is connected to the collector of the transistor 20 whilst the emitter of the transistor 51 is connected via a resistor 52 to the conductor 15 connected to the positive potential $+U_B$. The inverting input of the operational amplifier 50 is directly connected to the connection point between the resistor 52 and the emitter of the transistor 51. The non-inverting input of the operational amplifier 50 is connected to the conductor 15 via a resistor 53 with which a capacitor 54 is connected in parallel. The capacitor 54 is necessary because the current source in the present case is used as impedance. The non-inverting input of the operational amplifier 50 is also connected via a resistor 55 to the connection point between the collectors of the transistors 51 and 20. As a result the current $I_2$ flowing through the transistor 51 and the resistors 53, 55 is always set equal to the current $I_1$ flowing through the transistor 41.

Since the current source 22 serves as impedance which is of very high resistance to alternating current but does not cause any large DC voltage drop, it can also be replaced by another impedance giving the same effect, in particular by an inductance.

Since the oscillator 24 and the emitter follower circuit formed by the transistor 20 have a finite internal resistance, in the capacitance measuring circuit of FIG. 1 in addition a voltage regulating circuit is provided which keeps the AC voltage at the emitter of the transistor 20 constant. The voltage regulating circuit includes a voltage-current converter 60 which is followed by a rectifier circuit 61. The voltage-current converter 60 may have the same makeup as the voltage follower stage serving as voltage-current converter in the capacitance measuring circuit with the transistor 20 and the two current sources 21 and 22, the only difference being that instead of the capacitor 11 with the variable measuring capacitance $C_M$ a capacitor 62 is present with a fixed reference capacitance $C_R$ in the emitter circuit of the transistor. The alternating current flowing through the capacitor 62 and proportional to the emitter AC voltage is converted by the rectifier 61 into a DC voltage $U_{ist}$ proportional thereto. The output of the rectifier circuit 61 is connected to the one input of a differential amplifier 63. Applied to the other input of the differential amplifier 63 is a constant reference voltage $U_{Ref}$ which can be obtained for example by means of a reference diode 64 and a resistor 65 from the operating voltage $U_B$. The differential voltage furnished at the output of the differential amplifier 63 is applied to the voltage control input of the oscillator 24. As a result the amplitude of the AC voltage $u_W$ generated by the oscillator 24 is regulated so that any control deviation is eliminated. As a result the AC voltage in the emitter circuit of the transistor 20 is kept at the constant value defined by the reference voltage $U_{Ref}$.

A particular advantage of the capacitance measuring circuit described resides in that it can be operated with very different frequencies of the oscillator 24. This is desirable because capacitance or admittance measuring circuits, depending on the field of use, must be operated with very different frequencies. Thus, in capacitive filling level measurement uses exist in which the measuring frequencies are less than 50 kHz and other uses in which the measuring frequencies are greater than 500 kHz. The capacitance measuring circuit described, on appropriate standardization of the measuring DC voltage, can readily operate in such a large frequency range. At all frequencies the operations can be carried out with a relatively small measuring voltage.

Furthermore, the circuit diagram of FIG. 1 shows that the capacitance measuring circuit permits the measurement of a capacitance or admittance grounded on one side without a transformer.

The capacitance measuring circuit described can also be modified in various respects. In particular, instead of the npn transistor 20 another amplifier element may be employed, for example a pnp transistor or a field-effect transistor. In every case the amplifier element is connected as voltage follower stage, the controlled current path being connected in each case through an adjustable current source to the one or other pole of the operating voltage source and the current being controlled by the adjustable current sources in dependence upon the measuring DC voltage. If the amplifier element is a pnp transistor the circuit diagram of FIG. 1 applies with the difference that the polarities of all the voltages are reversed With other types of bipolar transistors the controlled current path is the collector-emitter path If the amplifier element is a field-effect transistor the controlled current path is the source-drain path.

The property of the measuring circuit described that the current requirement adapts itself to the magnitude of the capacitance or admittance to be measured is not only of advantage when the measuring circuit receives its supply direct current via a two-wire line via which the measured value signal is also transmitted by varying the total direct current, but also in other cases in which a minimum current requirement is desired. This applies for example for battery-operated devices in which the life of the battery is increased by reducing the current consumption at small measured values of the capacitance or admittance.

I claim:

1. A circuit arrangement for measuring the capacitance or admittance of a test object by the principle of apparent current measurement in which an AC voltage of fixed magnitude and frequency is applied to the test object and the alternating current flowing through the test object is used as a measure of the capacitance or admittance value, said circuit arrangement comprising:

(a) a first amplifier element wired as a voltage follower, said first amplifier element having a current path extending between a first and a second current path terminal and a control electrode to which said AC voltage is applied, said test object being connected in an output circuit of said first amplifier element to said first current path terminal;

(b) a DC supply voltage source furnishing a constant DC supply voltage between a first and a second voltage source terminal;

(c) a first adjustable current source connected between said first current path terminal and said first voltage source terminal, with the first adjustable current source determining a direct current flowing through said current path, the direct current determined by said current source being adjustable by means of a DC control voltage;

(d) a circuit component having a high impedance for alternating current which is connected between said second current path terminal and said second voltage source terminal;

(e) a rectifier circuit connected to said second current path terminal for converting the alternating current flowing from said second current path terminal to said rectifier circuit to a DC measuring voltage which is proportional to said alternating current; and (f) a control circuit receiving said DC measuring voltage and for generating said DC control voltage supplied to said adjustable current source so that the direct current determined by said current source is adjusted in dependence upon said DC measuring voltage in such a manner that the direct current is always slightly greater than the peak value of the alternating current flowing through the test object.

2. Circuit arrangement according to claim 1, wherein said control circuit comprises a second amplifier that receives said DC measuring voltage as one input and a fixed voltage independent of said DC measuring voltage as a second input.

3. Circuit arrangement according to claim 1, wherein said circuit component connected between said second current path terminal and said second voltage source terminal is an inductor.

4. Circuit arrangement according to claim 1, wherein said circuit component connected between said second current path terminal and said second voltage source terminal is a second adjustable current source which is automatically adjusted in synchronism with said first adjustable current source so that the direct currents determined by the two adjustable current sources are substantially equal.

5. Circuit arrangement according to claim 1, wherein said first amplifier element is a bipolar transistor having an emitter which forms said first current path terminal, a collector which forms said second current path terminal, and a base which forms said control electrode, said test object being connected in parallel with said first adjustable current source between said emitter and said first voltage source terminal, said circuit component having a high impedance for alternating current being connected between said collector and said second voltage source terminal, and said rectifier circuit being connected to said collector.

6. Circuit arrangement according to claim 1, further comprising a voltage regulating circuit which regulates the AC voltage applied to the control electrode of said first amplifier element in dependence upon the AC voltage applied to said test object to maintain said AC voltage applied to said test object at a constant value.

7. Circuit arrangement according to claim 6, wherein said voltage regulating circuit includes:

(a) a voltage-current converter which converts the AC voltage applied to said test object into an alternating current proportional thereto;
(b) a rectifier circuit following said voltage-current converter, the rectifier circuit converting the alternating current furnished by said voltage-current converter to a DC voltage proportional thereto; and
(c) a differential amplifier which compares to DC voltage furnished by said rectifier circuit with a fixed reference voltage and which furnishes an output signal representing the deviation between the two compared voltages, said output signal controlling the amplitude of the voltage applied to the control electrode of said first amplifier element to eliminate said deviation.

8. Circuit arrangement according to claim 7, wherein said voltage-current converter comprises a bipolar transistor having an emitter and a collector, a third current source attached to the emitter, a forth current source attached to the collector, and a fixed reference capacitance element connected to the emitter in parallel with the third current source.

* * * * *